ALIGNING METHOD

Filed Aug. 16, 1965

INVENTORS.
Charles J. Trzyna
Thaddeus S. Trzyna
By Dressler, Goldsmith, Clement, Gordon & Ladd
ATTORNEYS.

United States Patent Office 3,447,924
Patented June 3, 1969

3,447,924
ALIGNING METHOD

Charles J. Trzyna, R.R. 2, Longrove, Ill. 60047, and Thaddeus S. Trzyna, 1840 Laurel St., South Pasadena, Calif. 91030

Filed Aug. 16, 1965, Ser. No. 479,826
Int. Cl. G03c 5/16
U.S. Cl. 96—36 19 Claims

ABSTRACT OF THE DISCLOSURE

A method for producing aligned configurations on opposite sides of a workpiece that is penetrable by high frequency radiation, such as X-rays. Opposite sides of the workpiece are coated with a substance that is photo-sensitive to X-rays and an image mask that defines portions opaque to X-rays is placed over one of the coated sides of the workpiece. The one side is exposed through the mask with X-rays so that the workpiece is penetrated by the X-rays and the photo-sensitive substance on both sides of the workpiece is simultaneously exposed to the X-rays. The photo-sensitive susbtance on both sides of the workpiece is then treated with an agent that reacts differently with the portions of the substance exposed to the X-rays than with the unexposed portions thereof.

This invention relates to a method for production aligned configuration on opposite sides of a sheet of material that is optically opaque.

It is often desirable in the manufacture of certain products to provide configurations such as markings and the like, on both sides of a sheet of material, which configurations are in precise alignment. The provision of aligned configurations is necessary, for example, where the material is to be etched from both sides, and the center line of each of the grooves resulting from the etching on one side is to meet the center line of each of the grooves resulting from etching the other side.

An illustrative example of a product wherein etching from both sides has been found highly effective to produce the desired result, is the aperture mask utilized in color television picture tubes. These masks ordinarily contain more than 300,000 perforations and the desired shape of the walls defining these perforations is such that etching them from only one side of the mask is often ineffective to meet the desired standards.

Although the method of the present invention is generally described in conjunction with the manufacture of color television aperture mask, it is to be understood that aperture masks are but an illustrative example of the numerous products to which the present invention can apply. Thus, the invention is not limited to use in the manufacture of aperture masks.

Generally, aperture masks are produced by coating a steel plate that is approximately 0.006 inch thick, with a photoresist. A photoresist basically is a substance which is photo-sensitive to certain radiation, such as visible light. The portion of the photoresist that has been exposed to the radiation to which it is sensitive will polymerize while the unexposed portion of the photoresist can be dissolved away with the proper solvent.

In the prior art method of producing aperture masks, the steel plate is coated on both sides with the photoresist material. A pair of image masks are then placed adjacent to the plate, each on opposite sides thereof, and the opaque portions of the image masks are aligned with each other as well as possible, so that the resulting images will be aligned to some degree. The photoresist coatings are then exposed to visible light through the image masks, so that portions of the photoresist on both sides of the steel plate are exposed, while other portions, which are blocked by the opaque portions of the masks, remain unexposed. The photoresist is developed and washed away with the portions of the photoresist that were exposed to light becoming polymerized and the unexposed portions thereof dissolving out with the wash. The plate is then etched, and the portions of the plate where the photoresist had been dissolved are susceptible to the etchant, while the polymerized portions of the photoresist do not allow the etchant to attack the underlying areas of the steel plate.

It is apparent that unless the image masks on opposite sides of the plate are in substantially perfect alignment during the exposure of the photoresist, the etched configurations on both sides of the steel plate will not be precisely aligned, and the resulting product will be imperfect, irregular and eccentric. It is very difficult to align the image masks on opposite sides of the steel plate and eccentricity of the etched configurations is likely to occur as a result of human error.

The method of the present invention obviates the necessity for aligning a separate image mask on each side of the steel plate in order to expose the photoresist coatings. Moreover, the method of the present invention obviates the chance of misalignment as well as the time consuming skill heretofore required in methods to align the opposed image masks.

To provide aligned etchable configurations on both sides of the workpiece in accordance with the principles of the present invention, the opposite sides of the workpiece are first coated with a photoresist that is sensitive to a radiation of a relatively low frequency such as visible light. The coated workpiece is then coated with a photoresist that is sensitive to a relatively higher frequency radiation, such as X-rays. An image mask having portions that are opaque to the radiation, such as lead where X-ray are utilized, is placed over only one of the coated sides of the workpiece. The side of the workpiece over which the mask is placed is exposed with a relatively high frequency radiation which penetrates the unshielded portions of the image mask and the workpiece, thus exposing the outer photoresist on both sides of the workpiece simultaneously from one side. The outer coatings on both sides of the workpiece are then treated with an agent that reacts differently with the portions of the photoresist that are exposed to the radiation than with the unexposed portions thereof, and the unexposed portions of the photoresist are dissolved to provide the inner photoresist coating with uncovered areas. The image mask is removed, and the workpiece is placed in proximity to visible light, whereby the uncovered portions of the inner photoresist coating will become exposed to the visible light and polymerized. The remainder of the outer coating is removed, and the unexposed portions of the inner photoresist coating are removed thereby providing uncovered areas on the workpiece which are susceptible to etching. The workpiece then can be etched from both sides, and the grooves defined by the etching on both sides will be very precisely aligned.

A more complete explanation of the invention is provided in the following description and is illustrated in the accompanying drawing, in which.

Figure 1:
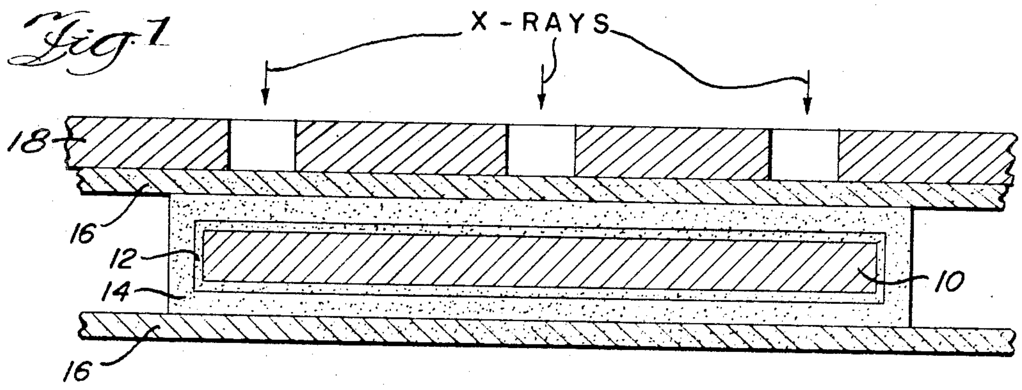
FIGURE 1 is a fragmentary sectional elevation of a coated workpiece being exposed with X-rays, in accordance with the principles of the present invention.

To provide etchable configurations on opposite sides of a steel plate, in one embodiment of the invention, two different photoresists are utilized. One of the photoresists is sensitive to radiation having a relatively long wavelength, such as visible light, and the other photoresist is sensitive to radiation of a relatively short wavelength, such as X-ray. The process forming this embodiment of the invention is illustrated in the drawing.

The workpiece 10 is first coated with the photoresist 12 that is sensitive to relatively low frequency radiation. A suitable photoresist is manufactured by Dynachem Corp. of Downey, Calif. under the name of Dynachem Resist Type 3140–5M. This composition is disclosed in U.S. patent application Ser. Nos. 229,605, filed Oct. 10, 1962 and 328,828, filed Dec. 9, 1963. The photoresist is soluble in a hydrocarbon such as xylene or toluol, but is insoluble in water until developed. The workpiece 10 is dipped into a container of the photoresist, producing a film having a thickness of between about 0.0005 inch to about 0.001 inch on both sides of the workpiece.

After the photoresist 12 is dried, a thin film of an X-ray sensitive, water soluble photoresist 14 is coated over the photoresist 12. A suitable water soluble X-ray sensitive photoresist is manufactured by the General Aniline & Film Corp. of New York under the name Ansco Template Emulsion. The photoresist 14 is applied by dipping the coated substrate into a container of the emulsion, producing an emulsion thickness in a range of about 0.002 inch to about 0.003 inch on both sides of the workpiece.

After the X-ray sensitive photoresist 14 has dried, a pair of fluorescent screens 16 are placed in contact with the opposite sides of the coated workpiece. These screens, which are used to reduce the X-ray exposure time, are of the calcium tungstate coated-type and are sold under the names of Du Pont High Speed Intensifing Screens and U.S. Radium Intensifing Screens.

A perforated image mask 18, which is composed of a suitable substance that is opaque to X-radiation, such as lead, is placed over one side of the workpiece, in contact with one of the fluorescent screens. The X-ray sensitive photoresist 14 is then exposed with X-rays from one side, through the image mask 18. In a specific example, an exposure time of five seconds was utilized at an X-ray intensity of 80 kilivolts and 14 milliamperes, with the X-ray source being at a distance of 9 inches from the top surface of the photoresist 14.

The exposed X-ray sensitive photoresist 14 is then developed so that the unexposed portions will dissolve. A suitable developing solution for the Ansco Template emulsion is sold under the name Du Pont Screen Process Developer, Solution A and Solution B. Another suitable developer consists of the following solutions, which are mixed prior to use:

Solution 1

| | | |
|---|---|---|
| Water | ml | 750 |
| Metol | g | 1.0 |
| Hydroquinone | g | 10.0 |
| Sodium metabisulfite | g | 10.0 |
| Sodium sulfite | g | 2.0 |

Water to make 1.0 liter.

Solution 2

| | | |
|---|---|---|
| Water | ml | 750 |
| Sodium carbonate, mono | gr | 100 |

Water to make 1.0 liter.

Figure 2:
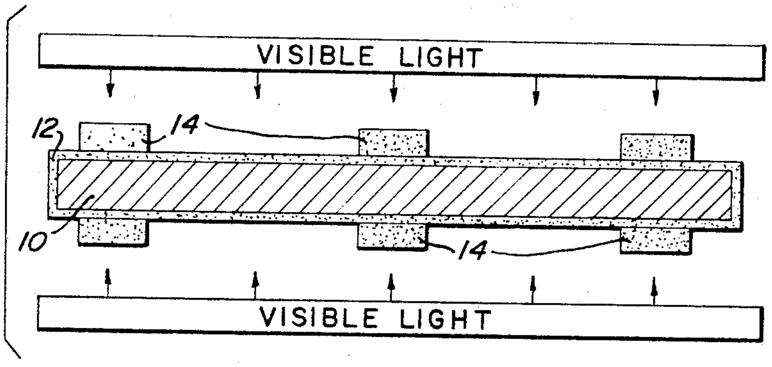
FIGURE 2 is a sectional elevation of the workpiece of FIGURE 1, after it has been exposed to X-rays and developed, during the step of being exposed to visible light.

The photoresist 14 is then fixed in a 5% acetic acid solution and the entire unit is exposed on both sides to visible light from two light sources 20 as shown in FIGURE 2. The dissolved portions of the X-ray sensitive photoresist 14 on both sides of the workpiece which were not exposed to the X-rays allow the visible light to be transmitted to photoresist 12, while the unexposed portions of the X-ray sensitive photoresist 14 remain opaque to the visible light.

After a suitable exposure of the photoresist 12 to visible light, the X-ray sensitive photoresist 14 is washed off with water at a temperature of approximately 90° F. As stated above, photoresist 12 is insoluble in water until developed and it will remain affixed to the workpiece 10. The visible light sensitive photoresist 12 is then developed in a suitable developing solution, such as a type sold by Dynachem Corp. of Downy, Calif., under the name Dynachem Developer, type 3140–5M. The portions of the photoresist 12 that have been exposed to the visible light will remain insoluble in water while the unexposed portions are washed away in the warm water. The washed-away portions leave etchable surfaces on the steel workpiece 10, which surfaces are precisely aligned on opposite sides of the workpiece. A suitable etchant such as a ferric chloride solution can then be utilized to etch through the workpiece 10 from both sides thereof to form a perforated article.

Figure 3:
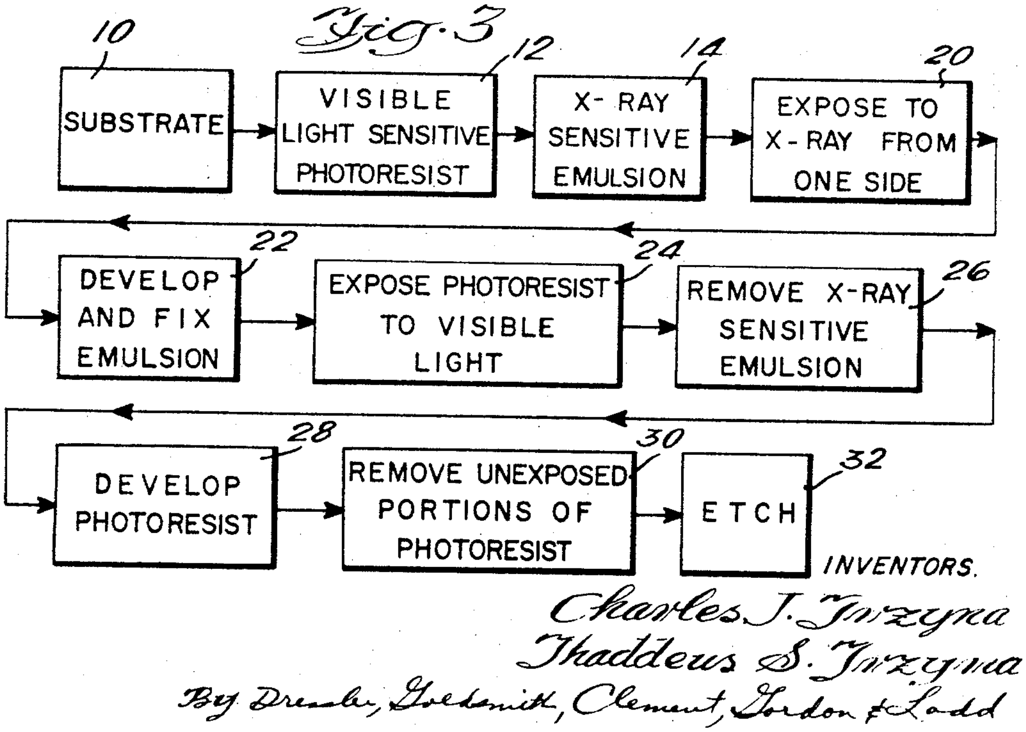
FIGURE 3 is a flow diagram showing the steps comprising the method of one embodiment of the present invention.

The steps of the illustrative embodiment of the present invention are shown in diagrammatic form in FIGURE 3 of the drawing. The workpiece 10 is first coated with a visible light sensitvie photoresist 12, which photoresist is then coated with an X-ray sensitive emulsion 14. The X-ray sensitive emulsion 14 is exposed to X-rays from one side thereof 20, and the emulsion is developed and fixed 22 to provide uncovered portions of the visible light sensitive photoresist 12.

The visible light sensitive photoresist is then exposed to visible light 24 and, after the X-ray sensitive emulsion 14 is removed 26, the visible light sensitive photoresist is developed 28 and the unexposed portions thereof are removed 30. Etchable surfaces on the workpiece are thereby provided, and a suitable etchant is applied 32 to form the perforated article.

As an alternate method of providing etchable configurations on opposite sides of the workpiece, the workpiece is coated on both sides thereof with a photoresist that is sensitive to X-rays. A mask comprising lead portions which take the form of the areas that are to be aligned and etched on the steel workpiece, is placed over one side of the workpiece. The photoresist is then exposed through the lead mask by X-rays of an intensity that will penetrate the steel workpiece and also expose the photoresist on both sides of the workpiece. The exposed portions of the photoresist will polymerize and the unexposed portions thereof can be dissolved in a suitable solvent.

As a specific example, a steel sheet 0.006 inch in thickness is coated on both sides thereof with the X-ray sensitive emulsion forming Example XIV of United States Patent No. 3,050,390. This photoresist comprises:

| | | |
|---|---|---|
| 10% gelatin | ml | 400 |
| Zinc oxide (dispersed in 60 ml. of water) | g | 60 |
| A solution made up from: | | |
| Acrylamide | g | 180 |
| N,N'-methylene-bis-acrylamide, 7 g. | ml | 90 |
| Water | c.c. | 120 |
| Saponin 8% | ml | 7.2 |
| Glycerin | ml | 3 |

To 25 ml. of the above composition are added 5 ml. of an aqueous solution containing .25 g. of silver nitrate.

After the emulsion coated on the steel workpiece has dried, a lead mask is placed in contact with the photoresist on one side of the workpiece. Portions of the photoresist are then exposed by X-rays which are directed through the X-ray transmissive portions of the lead mask, and the exposed portions of the photoresist on both sides of the workpiece are polymerized. The photoresist-coated steel workpiece is then washed in water, causing the unpolymerized material to dissolve out, thereby providing etchable configurations.

Where a perforated article is desired, the image mask comprises an X-ray transmissive material with lead "dots" (each dot being approximately the desired size of each perforation) affixed thereto.

Another X-ray sensitive photoresist material which could be used in the method of the present invention is disclosed in Example 5 of U.S. Patent No. 3,066,117. This photoresist is produced as follows:

About 1.16 grams (about 0.008 mol) of $\alpha,\alpha'$-diaminopropyl methylamine, about 0.25 gram (about 0.002 mol) of $\alpha,\alpha'$-diaminopropyl ether and about 2.46 grams (about 0.010 mol) of 1,4-phenylene-bis-acrylic acid dimethyl ester are heated in a nitrogen atmosphere while stirring for about 1 hour at about 120° C. and then for another 4 hours at from about 170° C. to about 180° C. The light yellow brittle resin obtained is readily soluble in dilute acetic acid. $\eta$ rel.=1.34 in 1% m-cresol solution; K=35.3.

The basic mixed polyamide is cast from 3.5% solution in N-acetic acid.

Using the last-mentioned photoresist, the material is exposed through the image mask with X-rays, or with gamma radiation using a cobalt 60 source. The X-rays or gamma rays penetrate the steel thereby exposing the photoresist on both sides of the steel workpiece. Since the exposed portions of the photoresist are insoluble, only the unexposed portions thereof are dissolved out with normal acetic acid to which 5% of sodium sulphate or 5% of Formalin solution has been added.

From the foregoing it is seen that the present invention provides a method for producing configurations that are precisely aligned on both sides of a workpiece. Such configurations allow the substrate to be etched from opposite sides thereof, resulting in precise, accurately aligned grooves. This process is also used for producing etchable configurations other than perforations, as the method of the present invention can be utilized wherever aligned configurations of any shape or size are desired on opposite sides of a workpiece. The workpiece may be formed of metal, or a material other than a metal, such as plastic, wood, etc.

The specific solutions and examples mentioned in the above description are merely illustrative of the many different types of photoresists and developing solutions which may be used to accomplish the method of this invention. Various modifications and substitutions in the materials and the steps of applying those materials may be made without departing from the spirit and scope of the present invention.

What is claimed is:

1. A method for producing aligned etchable configurations on a non-light transmissive workpiece that is penetrable by a first radiation, which includes the steps of: coating the opposite sides of the workpiece with a first substance that is photo-sensitive to a second radiation having a longer wavelength than said first radiation wavelength; coating said first substance on opposite sides of said workpiece with a second substance that is photo-sensitive to said first radiation; placing an image mask that defines portions opaque to said first radiation over one of the coated sides of the workpiece; exposing said one side through said mask with said first radiation; treating the second substance on both sides of said workpiece with an agent that reacts differently with the portions of the second substance that are exposed to said first radiation than with the unexposed portions thereof to enable portions of said first substance to be exposed to said second radiation; exposing both sides of said workpiece to said second radiation; removing said second substance; and removing from both sides of the workpiece only the portions of the first substance that are not exposed to said second radiation, while allowing the exposed portions of the first substance to remain on said workpiece.

2. A method for producing aligned etchable configurations on a non-light transmissive workpiece that is penetrable by a first radiation, which includes the steps of: Coating the opposite sides of the workpiece with a first substance that is photo-sensitive to a second radiation having a longer wavelength than said first radiation wavelength; coating said first substance on opposite sides of said workpiece with a second substance that is photosensitive to said first radiation; placing an image mask that defines portions opaque to said first radiation over one of the coated sides of the workpiece; exposing said one side through said mask with said first radiation; treating the second substance on both sides of said workpiece with an agent that reacts differently with the portions of the second substance that are exposed to said first radiation than with the unexposed portions thereof to enable portions of said first substance to be exposed to said second radiation; exposing both sides of said workpiece to said second radiation to provide exposed portions of said first substance and also unexposed portions thereof; removing said second substance; and removing from both sides of the workpiece the exposed and portions of the first substance.

3. The method for producing aligned etchable configurations of claim 1 wherein said first radiation comprises X-rays and said second radiation comprises visible light.

4. The method for producing aligned etchable configurations of claim 2 wherein said first radiation comprises X-rays and said second radiation comprises visible light.

5. A method of perforating metals that are penetrable by a high frequency radiation which includes the steps of: coating opposite sides of the metal with a substance that is photo-sensitive to said radiation; placing an image mask that has circular dots opaque to said radiation over one of the coated sides of the metal; exposing said one side through said mask with said radiation whereby the workpiece is penetrated by said radiation and the substance on both sides of said workpiece is simultaneously exposed to said radiation; and removing from both sides of said metal only the portions of the substance that have not been exposed to said radiation, while allowing the exposed portions of the substance to remain on said metal, said unexposed portions taking the form of the areas within a plurality of circles; and etching through the metal from both sides thereof with an etchant to which said substance is substantially immune.

6. A method of perforating metals that are penetrable by a high frequency radiation which includes the steps of: coating opposite sides of the metal with a substance that is photo-sensitive to said radiation; placing an image mask that defines circular portions that are transmissive to said radiation over one of the coated sides of the metal; exposing said one side through said mask with said radiation whereby the workpiece is penetrated by said radiation and the substance on both sides of said workpiece is simultaneously exposed to said radiation to provide exposed portions of the substance and also unexposed portions thereof; and removing from both sides of said metal said exposed portions of the substance, said unexposed portions defining a plurality of circles; and etching through the metal from both sides thereof with an etchant to which said substance is substantially immune.

7. A method of perforating metals that are penetrable by a first radiation which includes the steps of: coating the opposite sides of the metal with a first substance that is photo-sensitive to a second radiation having a longer wavelength than said radiation wavelength; coating said first substance on opposite sides of said metal with a second substance that is photo-sensitive to said first radiation; placing an image mask that defines circular portions that are transmissive to said first radiation and other portions that are opaque to said first radiation over one of the coated sides of the metal; exposing said one side through said mask with said first radiation; treating the second substance on both sides of said metal with an agent that reacts differently with the portions of the second substance that are exposed to said first radiation than with the unexposed portions thereof to enable portions of said first substance to be exposed to said second radiation; exposing the first substance on both sides of said metal to said second radiation; removing said second substance from both sides of the metal; removing from both sides of the metal only the portions of the first substance that are not exposed to said second radiation while allowing the exposed portions of the first substance to remain on said metal; said unexposed portions taking the form of the areas within a plurality of circles; and etching through the metal from both sides thereof with an etchant to which said substance is substantially immune.

8. A method of perforating metals that are penetrable by a first radiation which includes the steps of: coating the opposite sides of the metal with a first substance that is photo-sensitive to a second radiation having a longer wavelength than said first radiation wavelength; coating said first substance on opposite sides of said metal with a second substance that is photo-sensitive to said first radiation; placing an image mask that defines portions opaque to said first radiation over one of the coated sides of the metal; exposing said one side through said mask with said first radiation; treating the second substance on both sides of said metal with an agent that reacts differently with the portions of the second substance that are exposed to said first radiation than with the unexposed portions thereof to enable portions of said first substance to be exposed to said second radiation; exposing the first substance on both sides of said metal to said second radiation to provide exposed portions of the first substance and also unexposed portions thereof; removing said second substance; and removing from both sides of the metal said exposed and portions of the first substance; and etching through the metal from both sides thereof with an etchant to which said substance is essentially immune.

9. The method of perforating metals of claim 7 wherein said first radiation comprises X-rays and said second radiation comprises visible light.

10. The method of perforating metals of claim 8 wherein said first radiation comprises X-rays and said second radiation comprises visible light.

11. In a method for producing aligned configurations on a non-light transmissive workpiece that is penetrable by a radiation, the steps of: coating opposite sides of the workpiece with a substance that is photo-sensitive to said radiation; placing an image mask that defines portions opaque to said radiation over one of the coated sides of the workpiece; exposing said one side through said mask with said radiation whereby the workpiece is penetrated by said radiation and the substance on both sides of said workpiece is simultaneously exposed to said radiation; and treating the substance on both sides of said workpiece with an agent that reacts differently with the portions of the substance exposed to said radiation than with the unexposed portions thereof.

12. The method for producing aligned configurations as defined by claim 11, wherein said radiation comprises X-rays.

13. The method for producing alinged configurations as defined in claim 11, wherein said radiation comprises gamma rays.

14. A method of producing aligned etchable configurations on a metal that is penetrable by a high frequency radiation which includes steps of: coating opposite sides of the metal with a substance that is photosensitive to said radiation; placing an image mask that defines portions opaque to said radiation over one of the coated sides of the metal; exposing said one side through said mask with said radiation whereby the workpiece is penetrated by said radiation and the substance on both sides of said workpiece is simultaneously exposed to said radiation; and removing from both sides of said metal only the portion of the substance that has not been exposed to said radiation, while allowing the exposed portion of the substance to remain on said metal.

15. A method of producing aligned etchable configurations on a non-light transmissive workpiece that is penetrable by a high frequency radiation which includes the steps of: coating opposite sides of the workpiece with a substance that is photo-sensitive to said radiation; placing an image mask that defines portions opaque to said radiation over one of the coated sides of the workpiece; exposing said one side through said mask with said radiation whereby the workpiece is penetrated by said radiation and the substance on both sides of said workpiece is simultaneously exposed to said radiation to provide exposed portions of the substance and also unexposed portions thereof; and removing from both sides of said workpiece, said exposed portions of the substance.

16. A method of perforating metals that are penetrable by a high frequency radiation which includes the steps of: coating opposite sides of the metal with a substance that is photo-sensitive to said radiation; placing an image mask that defines circular portions that are opaque to said radiation and other portions that are transmissive to said radiation over one of the coated sides of the metal; exposing said one side through said mask with said radiation whereby the workpiece is penetrated by said radiation and the substance on both sides of said workpiece is simultaneously exposed to said radiation to provide exposed portions of the substance and also unexposed portions thereof; and removing from both sides of said metal said unexposed portions of the substance, said unexposed portions defining a plurality of circles; and etching through the metal from both sides thereof with an etchant to which said substance is substantially immune.

17. A method of perforating metals that are penetrable by a first radiation which includes the steps of: coating the opposite sides of the metal with a first substance that is photo-sensitive to a second radiation having a longer wavelength than said first radiation wavelength; coating said first substance on opposite sides of said metal with a second substance that is photo-sensitive to said first radiation; placing an image mask that defines portions opaque to said first radiation over one of the coated sides of the metal; exposing said one side through said mask with said first radiation; treating the second substance on both sides of said metal with an agent that reacts differently with the portions of the second substance that are exposed to said first radiation than with the unexposed portions thereof to enable portions of said first substance to be exposed to said second radiation; exposing the first substance on both sides of said metal to said second radiation to provide exposed portions of the first substance and also unexposed portions thereof; removing said second substance; and removing from both sides of the metal said unexposed portions of the first substance; and etching through the metal from both sides thereof with an etchant to which said substance is substantially immune.

18. The method of perforating metals of claim 17 wherein said first radiation comprises X-rays and said second radiation comprises visible light.

19. A method of producing aligned etchable configurations on a non-light transmissive workpiece that is penetrable by a high frequency radiation which includes the steps of: coating opposite sides of the workpiece with a substance that is photo-sensitive to said radiation; placing an image mask that defines portions opaque to said radiation over one of the coated sides of the workpiece; exposing said one side through said mask with said radiation whereby the workpiece is penetrated by said radiation and the substance on both sides of said workpiece is simultaneously exposed to said radiation to provide exposed portions of the substance and also unexposed portions thereof; and removing from both sides of said workpiece said unexposed portions of the substance.

References Cited

UNITED STATES PATENTS

| | | | |
|---|---|---|---|
| 2,257,143 | 9/1941 | Wood | 96—36 X |
| 2,257,143 | 9/1941 | Wood | 96—36 X |
| 2,382,674 | 8/1945 | Staud | 250—65 |
| 3,050,390 | 8/1962 | Levinos et al. | 96—115 X |
| 3,066,117 | 11/1962 | Thoma et al. | 96—115 X |
| 3,282,756 | 11/1966 | Hawley | 250—65 X |

J. TRAVIS BROWN, *Primary Examiner.*

R. E. MARTIN, *Assistant Examiner.*

U.S. Cl. X.R.

96—36.2; 250—65

PO-1050
(5/69)

UNITED STATES PATENT OFFICE
CERTIFICATE OF CORRECTION

Patent No. 3,447,924 Dated June 3, 1969

Inventor(s) Charles J. Trzyna and Thaddeus S. Trzyna

It is certified that error appears in the above-identified patent and that said Letters Patent are hereby corrected as shown below:

Column 1, line 29, "production" should be -- producing --.

Column 2, line 35, "X-ray" should be -- X-rays --.

Column 3, line 23, "Aniline" should be -- Analine --.

Column 4, line 21, "sensitvie" should be -- sensitive --.

Column 6, line 17, after "exposed" delete -- and --.

Column 6, line 47, after "radiation" insert -- and other portions that are opaque to said radiation --.

Column 6, line 63, after "said" insert -- first --.

Column 7, line 33, after "exposed" delete -- and --.

Column 7, line 60, "alinged" should be -- aligned --.

SIGNED AND
SEALED
MAR 3 - 1970

(SEAL)
Attest:

Edward M. Fletcher, Jr.
Attesting Officer

WILLIAM E. SCHUYLER, JR.
Commissioner of Patents